(12) United States Patent
Baumgartner et al.

(10) Patent No.: US 7,779,378 B2
(45) Date of Patent: *Aug. 17, 2010

(54) COMPUTER PROGRAM PRODUCT FOR EXTENDING INCREMENTAL VERIFICATION OF CIRCUIT DESIGN TO ENCOMPASS VERIFICATION RESTRAINTS

(75) Inventors: Jason Raymond Baumgartner, Austin, TX (US); Robert Lowell Kanzelman, Rochester, MN (US); Hari Mony, Austin, TX (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 124 days.

This patent is subject to a terminal disclaimer.

(21) Appl. No.: 12/180,533

(22) Filed: Jul. 26, 2008

(65) Prior Publication Data
US 2009/0049416 A1 Feb. 19, 2009

Related U.S. Application Data

(63) Continuation of application No. 11/301,112, filed on Dec. 12, 2005, now Pat. No. 7,509,605.

(51) Int. Cl.
*G06F 17/50* (2006.01)
(52) U.S. Cl. .............. 716/5; 716/1; 716/2; 716/3; 716/4; 716/11
(58) Field of Classification Search .......... 716/1–5, 716/11
See application file for complete search history.

(56) References Cited

U.S. PATENT DOCUMENTS 6,279,144 B1  8/2001  Henkels (Continued)

FOREIGN PATENT DOCUMENTS

TW  494325  7/2002

(Continued)

OTHER PUBLICATIONS

Zhang, "TEG: A New Post-Layout Optimization Method," IEEE Transactions on Computer-Aided Design of Integrated Circuits nad Systems, vol. 22, No. 4, pp. 446-456.

*Primary Examiner*—Helen Rossoshek
(74) *Attorney, Agent, or Firm*—Anthony V S England; Joseph P. Lally; Casimer K. Salys (57) ABSTRACT

An incremental verification method includes eliminating verification constraints from a first netlist and using the resulting netlist to create a constraint-free composite netlist suitable for determining equivalence between the first netlist and a second netlist of a design. Eliminating a constraint from a netlist may include adding a modified constraint net where the modified constraint net is FALSE for all cycles after any cycle in which the original constraint is FALSE. The method may include, instead of eliminating constraints, determining that the verification result is a target-not-asserted result and that the second netlist constraints are a superset of the first netlist constraints or that the verification result is a target-asserted result and that the first netlist constraints are a superset of the second netlist constraints. In either case, the method may include creating the composite netlist by importing all of the original constraints into the composite netlist.

4 Claims, 4 Drawing Sheets

U.S. PATENT DOCUMENTS

| | | |
|---|---|---|
| 6,651,235 B2 | 11/2003 | Dai et al. |
| 6,910,194 B2 | 6/2005 | Mielke |
| 6,957,178 B2 | 10/2005 | Musliner |
| 6,993,734 B2 | 1/2006 | Baumgartner |
| 7,039,564 B2 | 5/2006 | Malik |
| 7,093,218 B2 | 8/2006 | Baumgartner |
| 7,107,559 B2 | 9/2006 | Lakshmanan |
| 7,149,110 B2 | 12/2006 | Tran |
| 7,322,017 B2 | 1/2008 | Baumgartner et al. |
| 7,356,792 B2 | 4/2008 | Baumgartner et al. |
| 2002/0091984 A1 | 7/2002 | Malik et al. |
| 2003/0083858 A1 | 5/2003 | Musliner et al. |
| 2004/0125653 A1 | 7/2004 | Tran et al. |
| 2004/0243807 A1 | 12/2004 | Hughes |
| 2005/0097488 A1 | 5/2005 | Lakshmanan et al. |
| 2005/0138649 A1 | 6/2005 | Schwabe |
| 2006/0236274 A1 | 10/2006 | Baumgartner et al. |
| 2007/0067746 A1 | 3/2007 | Baumgartner et al. |
| 2007/0106963 A1 | 5/2007 | Baumgartner et al. |
| 2007/0271534 A1 | 11/2007 | Baumgartner et al. |
| 2008/0052650 A1 | 2/2008 | Baumgartner et al. |
| 2008/0066031 A1 | 3/2008 | Baumgartner et al. |
| 2008/0066033 A1 | 3/2008 | Baumgartner et al. |
| 2008/0066034 A1 | 3/2008 | Baumgartner et al. |

FOREIGN PATENT DOCUMENTS

| | | |
|---|---|---|
| TW | 563043 | 11/2003 |
| WO | WO 02/01424 A2 | 1/2002 |

COMPUTER PROGRAM PRODUCT FOR EXTENDING INCREMENTAL VERIFICATION OF CIRCUIT DESIGN TO ENCOMPASS VERIFICATION RESTRAINTS

CROSS-REFERENCE TO RELATED APPLICATION

This application is a continuation of prior application Ser. No. 11/301,112, which was originally filed on Dec. 12, 2005, now U.S. Pat. No. 7,509,605.

BACKGROUND

1. Field of the Present Invention

The present invention relates to the field of integrated circuit design and more particularly to the field of integrated circuit design verification systems.

2. History of Related Art

In the field of integrated circuit design, formal verification refers to the process of rigorously proving that a design satisfies its specification. Typically, the specification of a verification problem includes a netlist-based representation of the design and a set of expected values for specified nets under specified conditions. As an example, a verification problem may include determining whether a state exists in which a CHECKSTOP net is asserted, where an asserted CHECKSTOP indicates a fault. Using formal verification, one either finds a counterexample trace depicting a sequence of values of the nets over time, similar to a simulation trace, that leads to an assertion of the CHECKSTOP net or proves that no such trace exists.

Formal verification is often performed using state space search algorithms. Such algorithms include unbounded and bounded exhaustive searches. Bounded exhaustive searches try to find an assertion of CHECKSTOP that can occur within N time steps from an initial state of the design. Unbounded exhaustive algorithms increase N until no states are encountered that have not already been encountered for smaller values of N (a condition termed "fixed-point"). If no path from an initial state to a violating state (a state in which CHECKSTOP is asserted) is encountered before fixed-point is reached, then correctness can be inferred.

The number of verification cycles required to perform an exhaustive state space search increases exponentially with the number of state holding elements or registers. This exponential relationship makes formal verification impractical for designs containing a very large number of state holding elements. As a result, design verification engineers have developed innovative techniques for simplifying the formal verification tasks. Two such techniques are incremental verification and constraint-based verification.

Incremental verification is a verification technique that is applicable when an existing design (the old design) is modified to create a new design. Incremental verification is motivated by the desire to re-use the results of verification performed on the old design. It is quite common in the design of integrated circuits that the netlist of an old design shares substantial similarity with netlists for the new design because design changes frequently affect a relatively small percentage of the nets in a design, especially later in the design cycle. When this is the case, it is usually easier to verify that the new design and the old design share a common behavior than to verify the new design "from scratch." Incremental verification takes advantage of this reality by creating a composite netlist that includes the netlists of the old and new design, creating a set of targets that indicate differences in behavior between the old and new designs, and verifying that none of these composite targets can be asserted. Additional detail of an incremental verification may be found in co-pending and commonly assigned U.S. Patent Application of Baumgartner et al. entitled Incremental, Assertion-Based Design Verification, U.S. patent application Ser. No. 10/782,673, filed Feb. 19, 2004, Publication No. 20050188337, published Aug. 25, 2005, which is incorporated by reference herein (referred to as the Incremental Verification Application).

Constraint-based verification is a verification technique in which constraints are applied to one or more nets of the design to limit verification coverage to a subset of the total state space of a design. The constraints applied to the design typically reflect conditions that cannot or are not permitted to occur during operation of the design in the field. For example, verification of a design may be constrained to only those cases where data inputs to the design exhibit either odd or even parity. Constraints are enforced during verification by creating and monitoring constraint nets that are indicative of the specified constraints. In one implementation, verification is performed only for states/cycles where all of the constraint nets are true (evaluate to "1"). Constraint-based verification reflects the reality that many theoretically achievable states in a design need not be formally verified because, in operation, those states are prohibited from occurring. An implementation of constraint-based verification is described in co-pending and commonly assigned U.S. patent application of Baumgartner et al., entitled Using Constraints In Design Verification, U.S. patent application Ser. No. 11/236,451, filed Sep. 27, 2005.

Unfortunately, the use of incremental verification paradigms in the presence of constraints is a difficult problem because constraints in one of the designs (e.g., the new design) may restrict the evaluation of the other design. Because improperly restricting one of the designs may result in incorrect results such as concluding that verification results for the old design are applicable to the new design, incremental verification techniques are not directly transferable in the presence of design constraints. It would be desirable to implement methods, systems, and software for combining the benefits of incremental and constraint based verification. More specifically, it would be desirable to implement incremental design verification principles to designs that have been verified using constraints.

SUMMARY OF THE INVENTION

The identified objective is addressed by a method for using incremental verification to apply a verification result obtained using a first netlist of a design to a second netlist of the design where at least one of the netlists includes a verification constraint. The method includes creating a modified first netlist by eliminating one or more verification constraints from the first netlist. The modified first netlist is used to create a composite netlist free of constraints and suitable for determining equivalence between the first and second netlists. Modifying the first netlist may include adding a modified constraint net to the first netlist wherein the modified constraint net is FALSE during any cycle occurring after a cycle in which a constraint net corresponding to the verification constraint is FALSE. The modified constraint net controls the assertion of a verification target such that the verification target is prevented from being asserted when the modified constraint net is FALSE. The first netlist may include a plurality of verification constraints and a corresponding plurality of constraint nets, in which case, the modified constraint net is FALSE during any cycle occurring after a cycle in which any constraint net is FALSE. The method may further include determining, prior to eliminating the verification constraints, that the verification result is a verification result in which a target is not asserted and that a FALSE value of any of a set of constraints in the second netlist implies a FALSE value of at least one of a set of constraints for the first netlist. In response, the method may include creating the composite netlist by importing all of the set of constraints from the second netlist into the composite netlist. Conversely, the method may also include, prior to eliminating the verification constraints, determining that the verification result is a verification result in which a target is asserted and that a FALSE value of any of a set of constraints in the first netlist implies a FALSE value of at least one of a set of constraints for the second netlist in which case the composite netlist may be created by importing all of the set of constraints from the first netlist into the composite netlist.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

A method for extending incremental verification techniques to encompass verification results that were subject to verification constraints is described. Verification constraints are constructs used in design verification applications. A verification constraint is a specially-labeled gate in a netlist or other model of a design. As suggested by its name, a verification constraint represents a limitation on the freedom of the verification toolset to explore the state space of the design. More specifically, a verification constraint prevents the verification application from exploring any "j" time-step trace in which any of one or more constraints evaluate to "0" during any of the "j" time steps. An illustrative example of a constraint follows: "if the design of a particular circuit includes a buffer and the buffer is full, then the inputs of the design are constrained to prevent new transfers of data."

The verification system and method operate on a model of an integrated circuit design. The model illustrated in this disclosure is a netlist that includes gates and edges. Edges represent interconnections between gates so that, for example, an edge connects a source gate to a sink gate. In the embodiment of concern in this disclosure, a gate falls into one of four broad functional categories, namely, constant gates, random gates, combinational gates, and sequential gates. A constant gate produces a logical level that does not vary with time. A random gate, also referred to as a primary input, may assume any logical level in any time step independent of all other gates. A combinational gate is a logical element such as an AND gate. A sequential gate is also known to as a register gate or simply a register. A register has two components associated with it, namely, an initial value function, and a next state function. The value of a register for time 0 is the value of the initial value function at time 0 while the value of a register at time "i+1" is equal to the value of its next state function at time "i."

Figure 1:
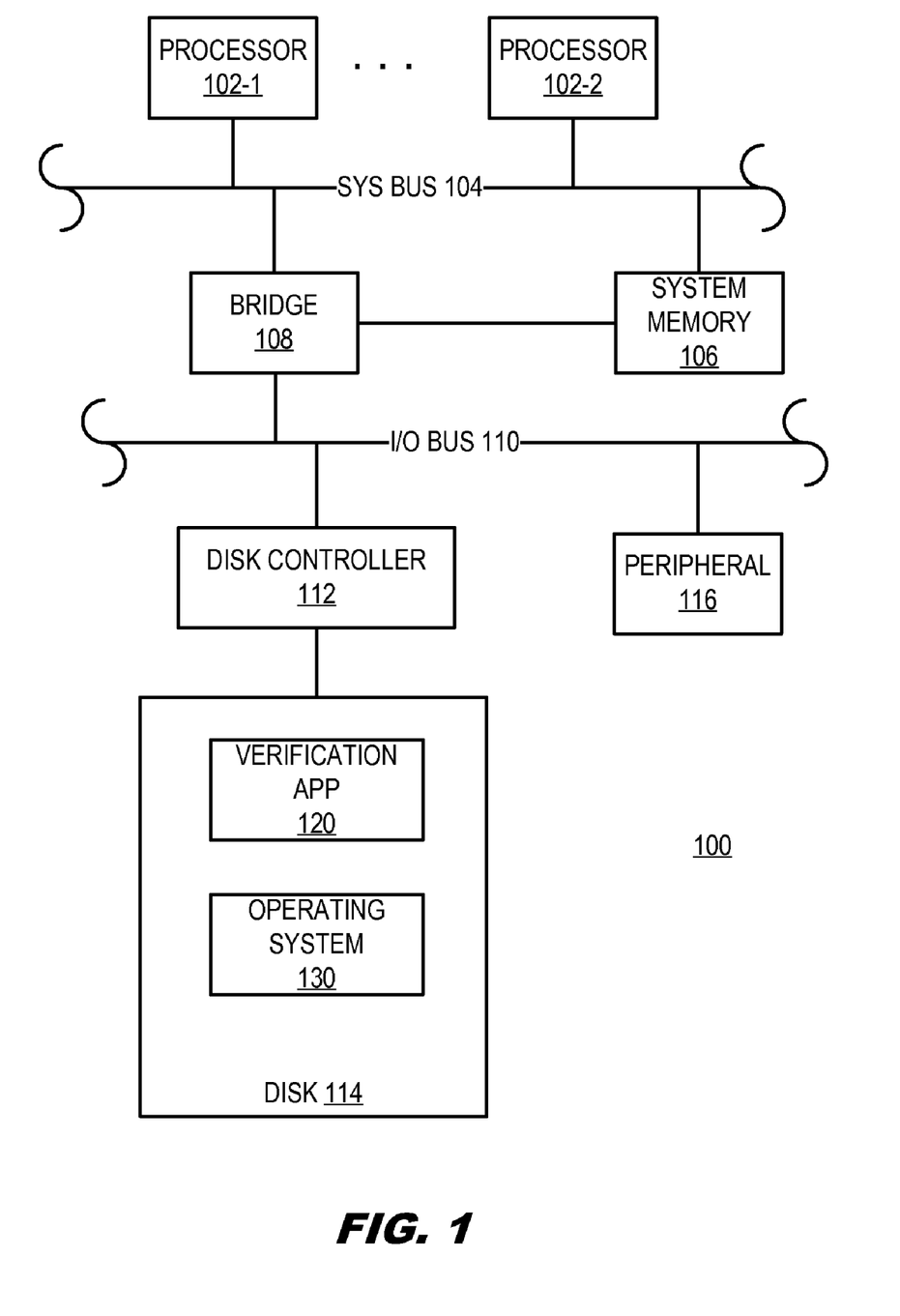
FIG. 1 is a block diagram of a data processing system suitable for implementing the design verification method.

In some embodiments, the invention is implemented as a data processing system having design verification functionality. Referring to FIG. 1, selected elements of a data processing system 100 suitable for discovering verification constraints according to the present invention (as described below with respect to FIG. 2 through FIG. 6) is depicted. In the depicted embodiment, system 100 includes general purpose processors 102-1 and 102-2 (generically or collectively referred to herein as processor(s) 102). The number of processors is implementation specific and other embodiments may have more or fewer processors 102.

Processors 102 share access to a high-speed system bus 104. A bus bridge 108 provides an interface between system bus 104 and a shared peripheral bus 110. Bus bridge 108 as depicted in FIG. 1 also includes memory control functionality and provides an interface between system bus 104 and a system memory 106. System memory 106 is most likely a volatile storage medium such as a relatively large array of DRAM elements. Peripheral bus 110 may be implemented as an industry standard peripheral bus such as a PCI (peripheral components interface) or PCI-X bus.

A disk controller 112 connected to peripheral bus 110 provides an interface to a hard disk 114. Disk 114 may store data and instructions used by processors 102. In the depicted embodiment, the instructions stored on disk 114 include an operating system 130 and a verification application 120 according to the present invention. Operating system 130 may be a commercially distributed operating system such as a Unix-based operating system, a Linux operating system, or a Windows® family operating system from Microsoft Corporation. The depicted embodiment of system 100 may include one or more additional peripheral devices represented by peripheral 116. Peripheral 116 may represent a network communication device (e.g., a network interface card) coupling system 100 to a network, a graphics adapter providing graphic display capabilities to system 100, or a number of other well known peripheral devices.

As suggested in the preceding paragraph, verification application 120 may be implemented as a set or sequence of computer executable instructions, stored on a computer readable medium, for verifying that a design meets its specification. The instructions may be stored on a persistent storage medium such as hard disk 114, a CD ROM (not depicted), floppy diskette (not depicted), magnetic tape (not depicted), and the like. The instructions may also be stored on a volatile storage medium such as system memory 106 or a cache memory (not depicted) of data processing system 100.

An embodiment of a design verification method that facilitates the use of incremental design verification techniques in the context of constraint-based verification is disclosed. As indicated previously, incremental verification is used to verify a second design, commonly referred to as the new design, when the new design is a revised version of a first design, commonly referred to as the old design.

A method of implementing incremental verification disclosed in the Incremental Verification Application is to route a net from the old design and the corresponding net from the new design to the inputs of an EXOR gate. The output of the EXOR gate is asserted only when the old design net and the new design net differ. Extending this concept, a composite netlist would include the old design netlist, the new design netlist, and a set of EXOR gates. Each of the EXOR gates would receive a first input from a target in the old design and its second input from the corresponding target in the new design.

By establishing that none of the composite targets (i.e., the outputs of the EXOR gates) can be asserted, one can conclusively demonstrate that results that are applicable to the old design are equally applicable to the new design. The Incremental Verification Application referenced above refines this concept by recognizing that proof of "full" EXOR equivalence is not required in most incremental verification applications. If one is attempting to reuse verification results performed on an old design in which a particular target was asserted, for example, it is sufficient for purposes of reusing the verification results on the new design to demonstrate a modified equivalence between the old and new designs. Specifically, it is sufficient to demonstrate that there is no state in which the target is asserted in the old design and not asserted in the new design. In other words, demonstrate that the logical expression (Old.Target AND NOT(New.Target)) is never TRUE. Conversely, if one is attempting to reuse verification results performed on an old design in which a particular target was not asserted, it is sufficient for purposes of reusing the verification results on the new design to demonstrate that there is no state in which the target is not asserted in the old design and is asserted in the new design. In other words, demonstrate that the logical expression (NOT(Old.Target) AND (New.Target)) is never TRUE. The Incremental Verification Application uses these concepts to simplify the equivalence logic implemented in a composite netlist.

Figure 2:
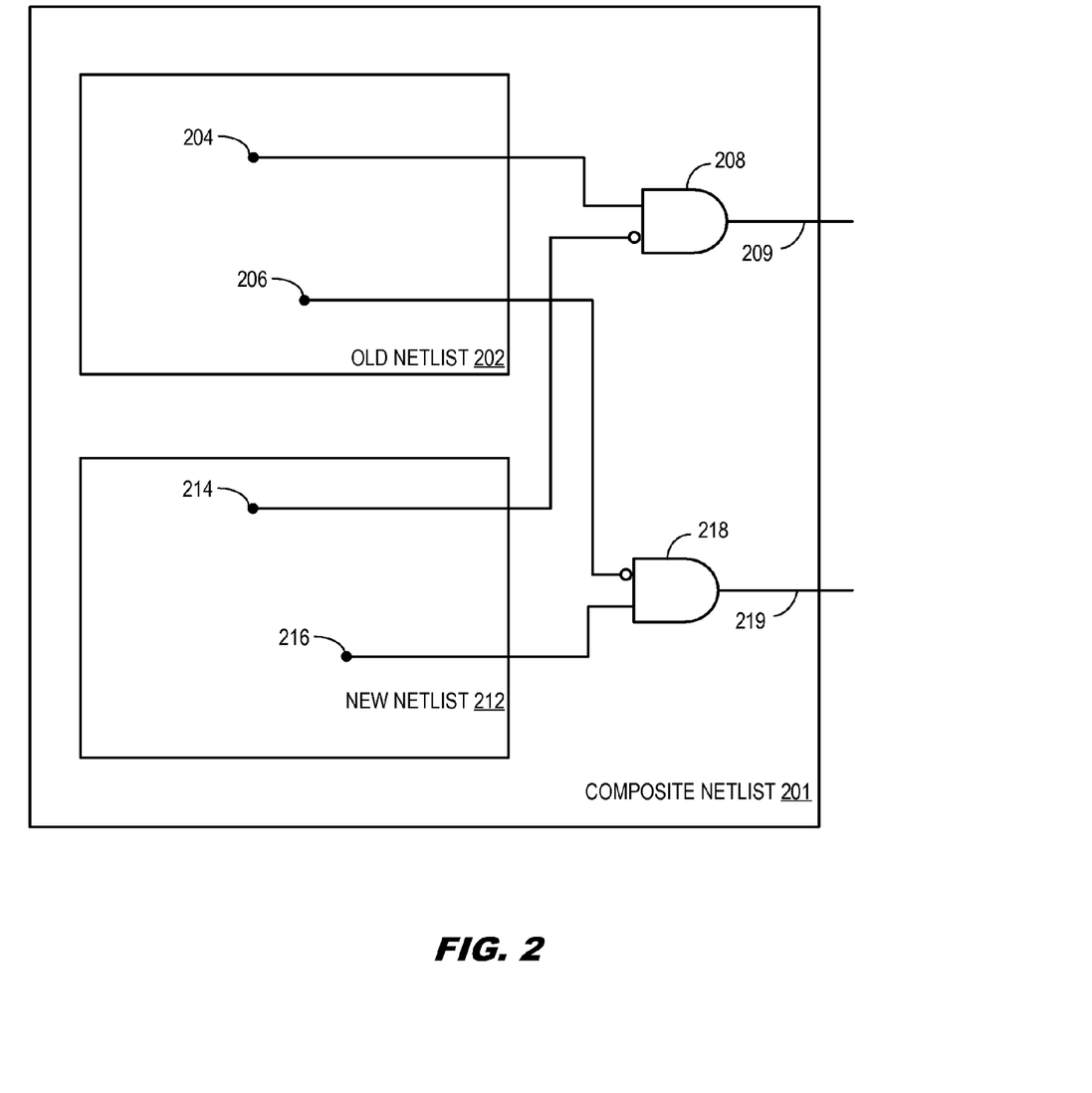
FIG. 2 illustrates an incremental verification technique for determining equivalence between first and second netlists of a design.

Referring to FIG. 2, an example of the equivalence logic disclosed in the Incremental Verification Application is depicted. In this example, equivalence checking is achieved by creating a composite design 201 that includes the a representation of the netlist of the old design 202 and the netlist of the new design 212. The creation of composite netlist 201 includes a determination of corresponding or parallel nets. In the depicted embodiment, a net 214 in new design 212 is determined to correspond functionally to net 204 in old design 202 and a net 216 in new design 212 is determined to correspond functionally to net 206 in old design 202. Assume further that prior verification efforts, i.e., verification efforts performed on old design 202 (or on a functionally equivalent predecessor of old design 202) demonstrated at least one state in which the net 204 is asserted while the prior verification efforts revealed no states in which net 206 was asserted. Correspondence checking according to the present invention includes creating a first composite net 209 and a second composite net 219. First composite net 209 employs a first type of equivalence logic 208 to confirm functional correspondence between net 204 of old design 202 and net 214 of new design 212. Second composite net 219 uses a second type of equivalence logic 218 to confirm the functional correspondence between net 206 of old design 202 and net 216 of new design 212.

Demonstrating that first composite net 209, which is the output of equivalence logic 208, cannot be asserted, indicates that there is no state in which net 204 from old design 202 is asserted (TRUE) and its proposed equivalent net 214 from new design 212 is not asserted (FALSE). Because the prior functional verification work performed on old design 202 proved the existence of a state in which net 204 was asserted, the positive equivalence result implies the existence of a state in new design 212 in which net 214 can also be asserted (TRUE). Similarly, demonstrating that second composite net 219, which is the output of the second type of equivalence logic 218, cannot be asserted, indicates that there is no state of composite design 201 in which net 216 is TRUE and net 206 is FALSE. Because the prior verification effort performed upon old design 202 discovered no states in which net 206 was asserted, the positive correspondence result in this case implies that, if one were to perform equivalent verification upon new design 212, one would not have discovered a state in which net 216 was asserted. In this manner, proving that a composite net (e.g., 209 or 219) cannot be asserted saves overall verification time by allowing reuse of results from prior verification work—including results demonstrating that a net can be asserted, that a net can never be asserted, or that a net cannot be asserted for N time-steps—from old design 202 to new design 212.

When verification constraints are introduced into the old design, the new design, or both, existing incremental verification approaches must be modified to ensure that the constraints on either the old design or the new design do not prevent discovery of incremental equivalence violations. As an example, an old netlist may include constraints that resulted in all old targets being unreachable. A new netlist may be substantially identical to the old netlist, but the new netlist may not have any constraints. If incremental verification is attempted by creating a composite netlist that includes the old constraints, the old constraints may "mask" a state in which a new target is asserted. As another example, imagine a simple design having two inputs, I1 and I2. The constraint in the new design is I1 (i.e., states in which I1 is FALSE are ignored for verification purposes), while a constraint in the old design is I2. Assume further that, for both designs, a target of interest is NOT(I2). The target is clearly unreachable in the old design, because I2 is constrained to be TRUE, but the target clearly reachable in the new design. Proper incremental verification should, therefore, account for the differences in constraints and discover the lack of equivalence between the old and new targets. If, however, the old constraint is simply incorporated into the composite netlist, the old constraint will restrict I2 in a manner that is inconsistent with the new netlist and therefore mask a valid assertion of the target in the new netlist and thereby falsely conclude an equivalence between the old and new targets.

Figure 3:
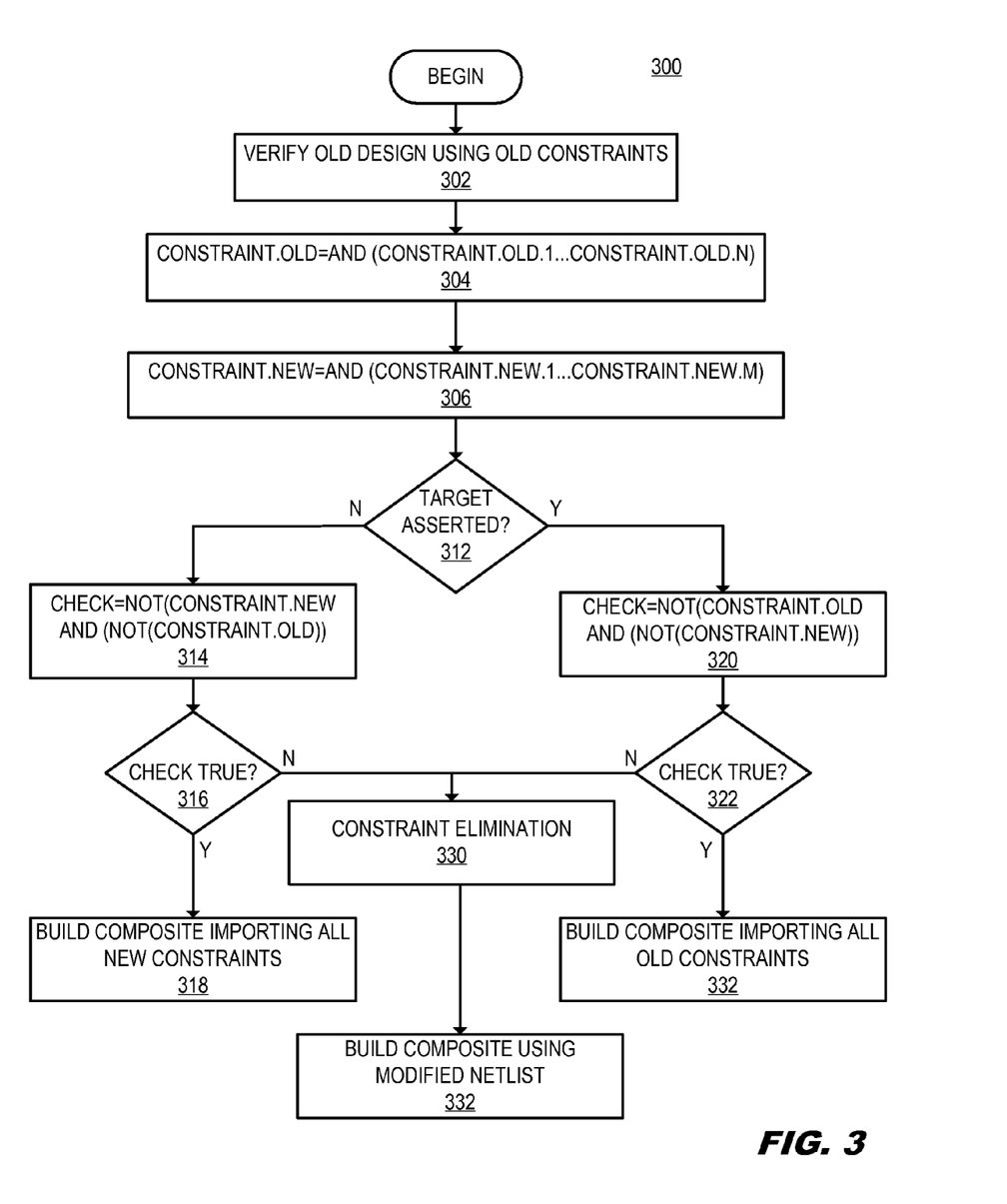
FIG. 3 is a flow diagram of a design verification method emphasizing incremental verification in the face of verification constraints.

Addressing the problem described above, a method of using incremental verification in the context of verification constraints is disclosed and described with respect to the flow diagram indicated in FIG. 3. Generally, the described verification method includes determining whether any constraints on the old design (old constraints) and any constraints on the new design (new constrains) are effectively equivalent. If equivalence is found, all constraints from the old and new netlists can be imported into the composite netlist. Like the procedure described in the Incremental Verification Application, constraint equivalence checking is preferably bifurcated into cases where verification results indicate a target as reachable and cases where verification results indicate a target as unreachable. If equivalence checking of constraints indicates a lack of equivalence, the constraints are systematically removed from the netlist. More specifically, the constraint nets are modified by the addition of circuitry that makes it possible to remove semantic conditions associated with constraint nets and thereby treat the modified constraint nets as all other nets in the netlist.

Turning now to FIG. 3, a flow diagram illustrates one embodiment of a constraint-compatible incremental verification method 300 for applying a verification result obtained using a first netlist representing a first version of a design to a second netlist representing a second version the design where the second version is incrementally different than the first version. Initially, verification results are generated by verifying (block 302) an old design using old constraints. In the depicted embodiment, method 300 then includes blocks 304 and 306 in which first and second nets are created. The first net, Constraint.Old, represents the logical AND of all constraints in the old netlist (i.e., Constraint.Old.1 through Constraint.Old.n where n is the number of constraints in the old netlist). The second net, Constraint.New, represents the logical ANN of all constraints in the new netlist (i.e., Constraint-.New.1 through Constraint.New.m where m is the number of constraints in the old netlist). The construction of these two nets aids in the determination of equivalence between the old constraints and the new constraints.

The constraint equivalence of interest is referred to as effective equivalence because strict equivalence (e.g., A implies B and B implies A) is not required. More specifically, whether or not it is permissible to incorporate all of the old and new constraints into a composite netlist for purposes of performing incremental verification when constraints are present depends upon the type of verification results for which incremental verification is proposed. If the verification results for the old design (the old verification) concluded that an old target was not or could not be asserted, the incremental verification attempts to determine whether there are any states in which the corresponding target in the new netlist (the new target) are asserted and the old target is not.

For target-not-asserted results, the new constraints can be incorporated into the composite netlist if one can demonstrate that a TRUE value of Constraint.New implies a TRUE value of Constraints.Old. Remembering that targets are evaluated only for states in which all constraints are TRUE, the logical expression Constraint.New AND NOT(Constraint.Old) indicates whether the old and new constraints can be incorporated into the composite netlist. If there is no state in which Constraint.New AND NOT(Constraint.Old) is TRUE, incorporation of all old and new constraints into the composite netlist is appropriate. This check guarantees that when Constraints.New=TRUE, Constraints.Old=TRUE is also true. Qualitatively, this check verifies that the new constraints are a superset of the old constraints and, therefore, that the incorporation of the new constraints into the composite netlist will only limit the behavior of the old targets in a way that is not of concern for the reuse of target-not-asserted verification results.

For target-asserted results, the old constraints can be incorporated into the composite netlist if one can demonstrate that there is no state of the composite design in which the new constraints mask the new target but the old constraints do not mask the old target. The logical expression Constraint.Old AND NOT(Constraint.New) indicates whether the old and new constraints can be incorporated into the composite netlist. If there is no state in which Constraint.Old AND NOT(Constraint.New) is TRUE, incorporation of all old and new constraints into the composite netlist is appropriate. This check guarantees that when Constraints.Old=TRUE, Constraints.New=TRUE is also true. Qualitatively, this check verifies that the old constraints are a superset of the new constraints and, therefore, that the incorporation of the old constraints into the composite netlist will only limit the behavior of the new targets in a way that is not of concern for the reuse of target-asserted verification results.

Method 300 as depicted thus determines (block 312) whether the verification results generated in block 302 are target-asserted results or target-not-asserted results. If the verification results are target-not-asserted results, method 300 defines (block 314) a net identified as CHECK where CHECK is equal to NOT(Constraint.New AND NOT(Constraint.Old)). Method 300 then determines (block 316) whether CHECK is TRUE for all states. If CHECK is true, then the composite netlist can be constructed (block 318) by importing all new constraints into the netlist. Similarly, if the old verification results are target-asserted results, method 300 defines (block 320) CHECK as equal to NOT(Constraint.Old AND (NOT(Constraint.New))) and determines (block 322) whether this CHECK is true. If so, the composite netlist can be constructed by incorporating all old constraints into the composite netlist. If CHECK is proven to be NOT TRUE in block 316 or block 322, method 300 proceeds to a constraint elimination phase (block 330) of the incremental verification to effectively eliminate the constraints from the composite netlist. Constraint elimination method 330 creates modified netlist(s) from the first netlist, the second netlist, or both by eliminating verification constraints from the first netlist, the second netlist, or both. The resulting modified netlist(s) are then used as a basis for creating a composite netlist (in block 332 of FIG. 3) with fewer constraints or no constraints at all.

Figure 4:
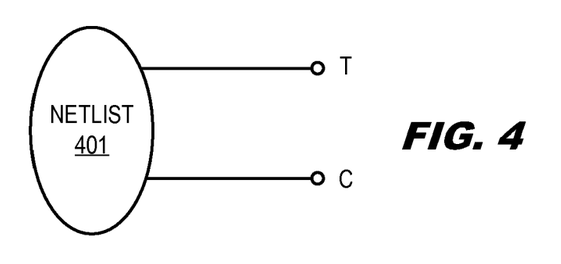
FIG. 4 depicts a netlist including a verification target and a verification constraint.
Figure 5:
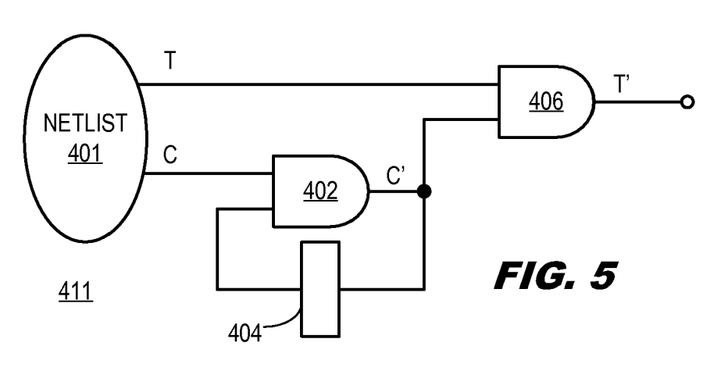
FIG. 5 depicts a modified netlist in which a modified verification constraint is created where the modified constraint goes FALSE and remains FALSE if the verification constraint is ever FALSE.
Figure 6:
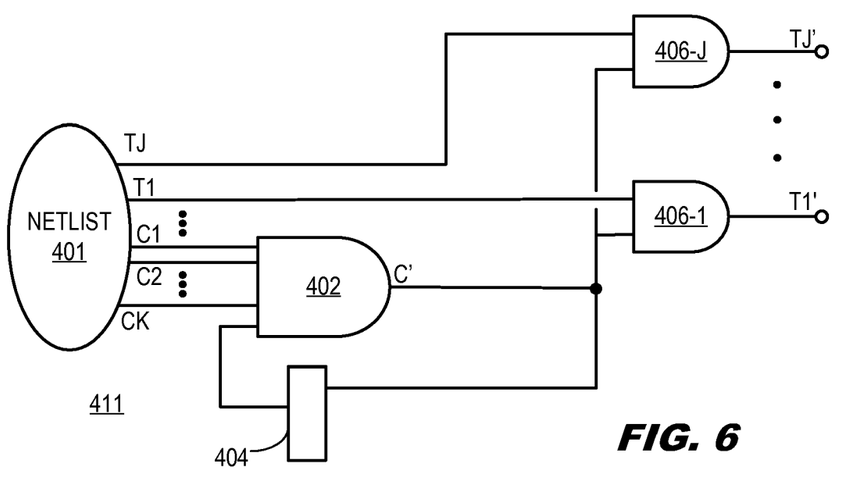
FIG. 6 depicts a generalized form of the netlist of FIG. 5 encompassing multiple constraints and multiple targets.

FIG. 4, FIG. 5, and FIG. 6 provide a conceptual illustration of method 300 of FIG. 3 for effectively eliminating constraints from a netlist to facilitate incremental verification when verification constraints have been applied to either the old netlist, the new netlist, or both. Ordinarily, constraint nets possess unique behavior characteristics that the verification engine must recognize and that complicate incremental verification for cases in which old constraints and new constraints differ. In the depicted embodiment, constraints are eliminated by synthesizing the constraint into a target so that the effect of constraint is reflected in the state of the target.

In FIG. 4, a netlist 401 is shown as including a target T and a constraint C. Verification engines recognize constraint nets such as net C as specially designated nets that control the verification engine's behavior. Specifically, verification engines check for assertions of target T, but only during cycles when the constraint C is asserted. Verification engines mask or otherwise disregard the state of target T during cycles in which constraint C is FALSE and terminate state space search following any state in which C is FALSE. As an example, if a verification engine is executing random simulation and encounters a state in which the constraint net C is FALSE, further state space exploration beyond that state in which the constraint was false is terminated.

In FIG. 5, circuitry is added to netlist 401 to create a modified netlist 411 in which the constraint C is used to synthesize a modified net C' that can be included in the netlist without classification as a constraint, but which has the same effect as the original constraint. Specifically, the modified constraint net designed to be FALSE during any cycle occurring after a cycle in which the original constraint net is FALSE. In the depicted embodiment, modified netlist 411 includes a first AND gate 402 and a register or latch 404. AND gate 402 receives the constraint C as one input and an output of latch 404 as its second input. The output of first AND gate 402, which represents the modified constraint net C', provides the input to latch 404 and to a second AND gate 406. The target T is routed to one of the inputs to second AND gate 406.

A FALSE value of constraint C during any cycle will drive the output of first AND gate 402 (C') to FALSE. The FALSE value of C' will then be fed back from the output of first AND gate 402, through latch 404, and to the input of AND gate 402 during the next cycle where the FALSE value will propagate another FALSE value on C'. In this manner, a single FALSE cycle of constraint C will cause C' to become and remain FALSE until latch 404 is cleared or otherwise reset. The permanent FALSE state of C' following the first cycle in which the constraint net C is FALSE ensures that the modified target T' cannot be asserted after any cycle in which the constraint C is FALSE. Preventing T' from becoming asserted after any assertion of constraint C is functionally equivalent to constraining the original target T with the constraint node C. Modified netlist 411 thus effectively eliminates the original constraint by introducing a functionally equivalent netlist that does not have the semantic constraints associated with the original netlist.

FIG. 6 depicts a generalized form of modified netlist 411 that encompasses multiple targets $T_1$ through $T_j$ and multiple constraints $C_1$ through $C_k$. In the depicted embodiment, the AND gate 402 receives an input from each constraint $C_1$ through $C_k$ of the original netlist. The output of AND gate 402 (C') is connected to the input of latch 404. The output of latch 404 provides an input to AND gate 402. The C' signal also provides an input to each of a set of AND gates 406-1 through 406-j, with each AND gate 406 receiving a second input from a corresponding one of the targets $T_1$ through $T_j$. The outputs of AND gates 406-1 through 406-j are the modified targets $T_1'$ through $T_j'$.

In the depicted implementation, a FALSE value of any constraint $C_1$ through $C_k$ during any cycle drives C' to a FALSE value that is maintained for all subsequent cycles. The FALSE value of C' prevents the assertion of any modified target $T_1'$ through $T_j'$. In this manner, the assertion of any constraint during any cycle prevents any target from being reached (becoming asserted) during any subsequent cycle, which is functionally equivalent to the corresponding unmodified netlist (i.e., a netlist without elements 402, 404, and 406) subject to the constraints $C_1$ through $C_k$. Because, however, modified netlist 411 of FIG. 6 does not require the imposition of constraint rules on any of the nets, it is suitable for use in conjunction with incremental verification techniques. Returning to FIG. 3, following the constraint of block 330, the modified netlist is used to build (block 332) a composite netlist for incremental verification purposes. As described above with respect to FIG. 2, the composite netlist is suitable for detecting differences in state between a target in the first netlist and an analogous target in the second netlist.

As depicted in FIG. 3, the constraint elimination of block 330 is only executed as a last resort. More specifically, in the case where the old verification results are target-not-asserted results, constraint elimination 330 is executed only if the composite model cannot be built by merely importing all new constraints (block 318) and, in the case where the old verification results are target-asserted results, constraint elimination 330 is executed only if the composite model cannot be built by merely importing all old constraints. In some applications, however, it may be desirable to perform constraint elimination even when importing all old or new constraints is a possibility. One such application involves the reuse of target-asserted results.

In the case of target-asserted results, importing all old constraints may be performed as in block 324 when the old constraints are a superset of the new constraints. However, applying the old constraints to the composite netlist may result in a false conclusion that a target is unreachable such as when the target would have been reachable but for the assertion of an old constraint on the new design when the old constraint is not part of the new constraints. Although the incremental verification is not incorrect in this case because the only consequence is that the old verification results are not propagated when it would have been acceptable to do so, this case represents "waste" in the sense that previously performed verification must be thrown out unnecessarily. For this reason, some embodiments may elect to proceed directly to constraint elimination block 330 after determining in block 312 that the old verification results are target-asserted results. Even more generally, because constraint elimination 330 is applicable to all types of verification results, other embodiments may proceed directly to constraint elimination from block 302.

It will be apparent to those skilled in the art having the benefit of this disclosure that the present invention contemplates a method and system for verifying the design of an integrated circuit. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A computer program product comprising a set of instructions, stored on computer readable medium, wherein the instructions are executable by a computer system to perform a method for applying a verification result obtained using a first netlist of a design to a second netlist of the design, wherein at least one of the first and second netlists includes a verification constraint, comprising:

instructions for constructing a composite netlist of the first netlist and the second netlist wherein the composite netlist is suitable for detecting differences in state between a target in the first netlist and an analogous target in the second netlist; and wherein the instructions for constructing the composite netlist includes instructions for choosing between an action selected from the group consisting of modifying a net corresponding to the verification constraint wherein the composite netlist is free of verification constraints and importing each of the constraints into the composite netlist; and wherein the instructions for creating the modified net includes instructions for adding a first AND gate and a latch to the composite netlist, wherein the constraint net provides a first input to the AND gate an output of the latch provides a second input to the AND gate and further wherein an output of the AND gate provides an input to the latch; and wherein the instructions for constructing the composite netlist comprises instructions for creating a modified target including instructions for adding a second AND gate wherein a first target provides a first input to the second AND gate and wherein the modified constraint net provides a second input to the second AND gate.

2. The computer program product of claim 1, wherein the instructions for modifying the net includes instructions for creating a modified net, wherein the modified net is FALSE during a cycle in which the constraint net is FALSE and for all cycles thereafter.

3. The computer program product of claim 2, further comprising instructions for controlling the state of a target in the composite netlist with the modified net, wherein the target is prevented from having a TRUE state during the cycle in which the constraint net is FALSE and for all cycles thereafter.

4. The computer program product of claim 1, wherein the instructions for importing the constraints into the composite netlist occurs if the first verification result is a verification result in which a target is not asserted and a set of verification constraints in the first netlist is a subset of a set of verification constraints in the second netlist or if the first verification result is a result in which a target is asserted and a set of verification constraints in the second netlist is a subset of a set of verification constraints in the first netlist.

* * * * *